United States Patent
Kubo et al.

(10) Patent No.: US 8,402,339 B2
(45) Date of Patent: Mar. 19, 2013

(54) ERROR CORRECTING DEVICE AND ERROR CORRECTING METHOD

(75) Inventors: Kazuo Kubo, Tokyo (JP); Takashi Mizuochi, Tokyo (JP); Hideo Yoshida, Tokyo (JP); Yoshikuni Miyata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 411 days.

(21) Appl. No.: 12/765,329

(22) Filed: Apr. 22, 2010

(65) Prior Publication Data

US 2010/0275104 A1    Oct. 28, 2010

(30) Foreign Application Priority Data

Apr. 28, 2009  (JP) ................. 2009-108876

(51) Int. Cl.
*H03M 13/00*    (2006.01)
(52) U.S. Cl. ............. 714/752; 714/755
(58) Field of Classification Search .......... 714/752, 714/755
See application file for complete search history.

(56) References Cited

U.S. PATENT DOCUMENTS

| | | | | |
|---|---|---|---|---|
| 5,392,299 A * | 2/1995 | Rhines et al. | ........... | 714/756 |
| 6,622,277 B1 * | 9/2003 | Ramanujam et al. | ...... | 714/755 |
| 6,868,514 B2 | 3/2005 | Kubo et al. | | |
| 7,043,162 B2 | 5/2006 | Kubo et al. | | |
| 7,440,475 B2 | 10/2008 | Kubo et al. | | |
| 2004/0268209 A1 * | 12/2004 | Srivastava et al. | ........ | 714/782 |
| 2005/0091565 A1 * | 4/2005 | Eroz et al. | ............... | 714/752 |
| 2005/0149820 A1 * | 7/2005 | Gastaldello et al. | ....... | 714/758 |

FOREIGN PATENT DOCUMENTS

JP   2009-17160   1/2009

OTHER PUBLICATIONS

"Digital Video Broadcasting (DVB); Second generation framing structure, channel coding and modulation systems for Broadcasting, Interactive Services, News Gathering and other broadband satellite applications." ETSI EN 302 307 V1.1.1, European Standard (Telecommunications series), Mar. 2005. pp. 1-74.
Yoshikuni Miyata, et al. "Proposal for Frame Structure of Optical Channel Transport Unit Employing LDPC Codes for 100 Gb/s FEC." Proc. Optical Fiber Communications Conf./National Fiber Optic Engineers Conf., San Diego, CA. 2009. NThB2. 3 pages.
Yoshikuni Miyata, et al. "Efficient FEC for Optical Communications using Concatenated Codes to Combat Error-floor." Proc. OFC/NFOEC, San Diego, CA. 2008. OTuE4. 3 pages.
"Series G: Transmission Systems and Media, Digital Systems and Networks; Series Y: Global Information Infrastructure, Internet Protocol Aspects and Next Generation Networks." International Telecommunication Union. ITU-T Recommendation G. 709/Y.1331. Mar. 2003. 117 pages.
U.S. Appl. No. 12/775,825, filed May 7, 2010, Sugihara et al.
Chinese Office Action issued Jun. 5, 2012 in Patent Application No. 201010170018.8 with Partial English Translation.
Peng Wanquan, "Study on Iterative Decoding of Concatenated Codes Based on Linear Superposition Feedback", Chinese selected doctoral dissertations & master's theses full-text databases, No. 2, 2006, pp. 15-17.

* cited by examiner

*Primary Examiner* — Philip Guyton
(74) *Attorney, Agent, or Firm* — Oblon, Spivak, McClelland, Maier & Neustadt, L.L.P.

(57) ABSTRACT

An error correcting device in an optical communication system that transmits a transmission frame formed by adding an overhead and an error correction code to information data uses a concatenated code or an iterated code of at least two error correction codes as an outer code and an error correction code for soft-decision decoding as an inner code.

9 Claims, 6 Drawing Sheets

ERROR CORRECTING DEVICE AND ERROR CORRECTING METHOD

BACKGROUND OF THE INVENTION

1. Field of the Invention

The present invention relates to an error correcting device and an error correcting method applied to a digital communication device such as an optical communication system.

2. Description of the Related Art

In conventional error correcting devices and methods, an error correcting method that uses a low-density parity-check (LDPC) code as an inner code and a Bose-Chaudhuri-Hocquenghem (BCH) code as an outer code is applied as forward error correction (FEC) (see, for example, ETSI EN 302 307 V1.1.1 (2005. 03) European Standard (Telecommunications series) pp. 19 to 23 (5.3)). Another error correcting method that uses an LDPC code as an inner code and a Reed-Solomon (RS) code as an outer code is also proposed (see, for example, Japanese Patent Application Laid-open No. 2009-17160).

Receiving devices that use the FEC coding systems according to ETSI EN 302 307 V1.1.1 and Japanese Patent Application Laid-open No. 2009-17160 perform error correction by soft-decision decoding of an LDPC code and correct residual errors in the LDPC code by using a BCH code or an RS code, thereby avoiding occurrence of an error floor phenomenon.

In the conventional error correcting devices and methods, a single error correction code is used as an outer code. Accordingly, when there are many residual errors in the LDPC code, characteristics are deteriorated. When redundancy of the outer code is increased to correct many residual errors, a transmission rate is increased and therefore realization of a high-speed optical communication system becomes difficult.

The present invention has been achieved to solve the above problems. An object of the present invention is to provide a high-quality and high-speed optical communication system in which many residual errors caused by soft-decision decoding of an inner code are corrected, even in a transmission channel that causes a higher rate of bit errors, by using an outer code capable of suppressing an increase in a transmission rate so that occurrence of an error floor is avoided.

SUMMARY OF THE INVENTION

In order to solve the aforementioned problems, an error correcting device in an optical communication system that transmits a transmission frame formed by adding an overhead and an error correction code to information data, the error correcting device includes an outer-code forward error correction (FEC)-coding unit that performs FEC coding with an outer code for the transmission frame by using a concatenated code or an iterated code of at least two error correction codes as the outer code; an inner-code FEC-coding unit that performs FEC coding with an inner code for the transmission frame by using an error correction code for soft-decision decoding as the inner code; an inner-code FEC-decoding unit that performs soft-decision FEC decoding with the inner code for the transmission frame received; and an outer-code FEC-decoding unit that performs hard-decision FEC decoding with the outer code for the transmission frame subjected to the soft-decision FEC decoding by the inner-code FEC-decoding unit.

According to another aspect of the present invention, an error correcting method used in an optical communication system that transmits a transmission frame formed by adding an overhead and an error correction code to information data, the error correcting method includes an outer-code FEC-coding step of performing FEC coding with an outer code for the transmission frame by using a concatenated code or an iterated code of at least two error correction codes as the outer code; an inner-code FEC-coding step of performing FEC coding with an inner code for the transmission frame by using an error correction code for soft-decision decoding as the inner code; an inner-code FEC-decoding step of performing soft-decision FEC decoding with the inner code for the transmission frame received; and an outer-code FEC-decoding step of performing hard-decision FEC decoding with the outer code for the transmission frame subjected to the soft-decision FEC decoding by the inner-code FEC-decoding step.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
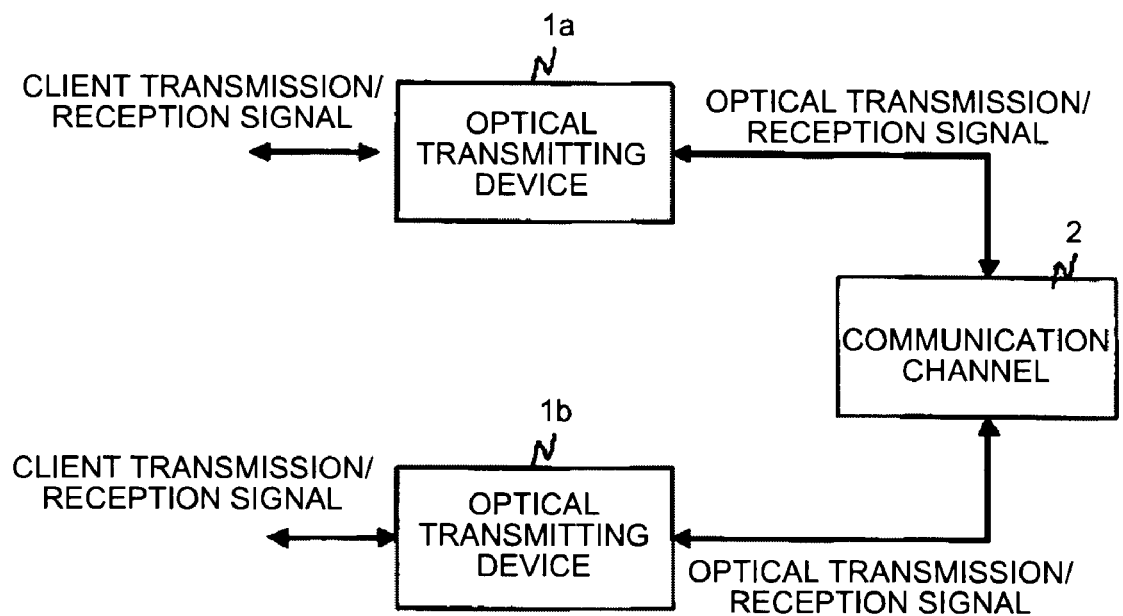
FIG. 1 is a configuration diagram of an error correcting device according to a first embodiment of the present invention.

FIG. 1 is a configuration diagram of a digital transmission system (hereinafter, simply referred to as "transmission system") that uses an error correcting device and an error correcting method according to a first embodiment of the present invention. As shown in FIG. 1, optical transmitting devices 1a and 1b perform interconversion of a client transmission/reception signal and an optical transmission/reception signal, such as mapping or demapping of a client signal and an optical transmission frame, error correction coding or decoding, and electrical/optical conversion, so as to provide bidirectional communications between the optical transmitting devices 1a and 1b through a communication channel 2.

Figure 2:
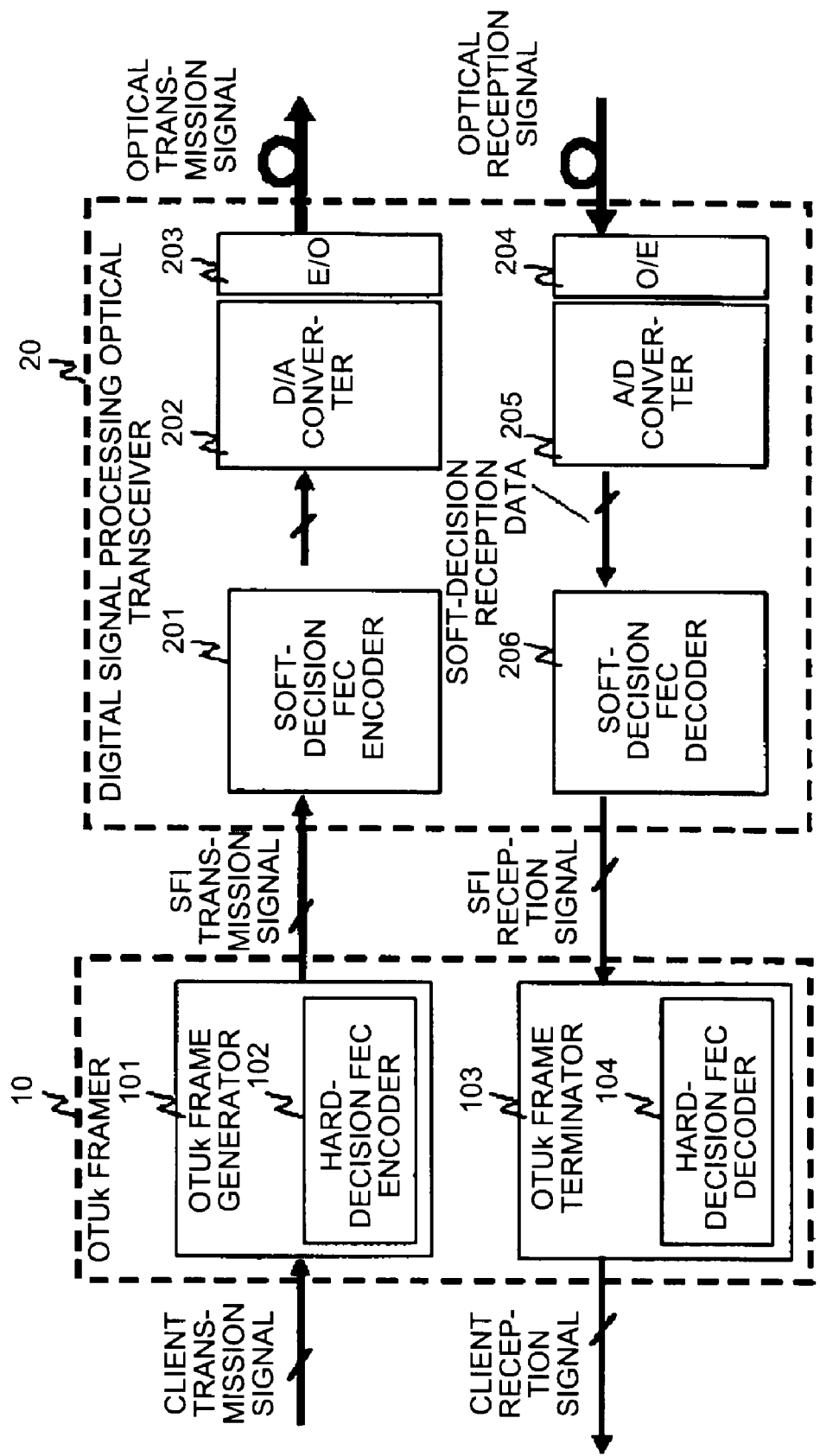
FIG. 2 is a detailed configuration diagram of the error correcting device according to the first embodiment.

FIG. 2 is a detailed configuration diagram of the optical transmitting device 1a or 1b shown in FIG. 1. As shown in FIG. 2, an optical channel transport unit-k (OTUk) framer 10 includes an OTUk frame generator 101 that performs mapping of a client transmission signal to an OTUk frame, generates an optical transmission frame by adding information required for frame synchronization and/or maintenance control to the OTUk frame, and outputs a serdes framer interface (SFI) transmission signal to a digital signal processing optical transceiver 20. The OTUk framer 10 further includes an OTUk frame terminator 103 that terminates the information required for frame synchronization and/or maintenance control in an SFI reception signal from the digital signal processing optical transceiver 20, performs demapping of a client reception signal from the OTUk frame, and outputs the demapped client reception signal. The OTUk frame generator 101 includes a hard-decision FEC encoder 102 as an outer-code FEC-coding unit. The OTUk frame terminator 103 includes a hard-decision FEC decoder 104 as an outer-code FEC-decoding unit. The digital signal processing optical transceiver 20 includes a soft-decision FEC encoder 201 as an inner-code FEC-coding unit that encodes the SFI transmission signal from the OTUk framer 10 by using a soft-decision error correction code, a digital/analog (D/A) converter 202 that performs D/A conversion of an output signal from the soft-decision FEC encoder 201, an electrical/optical (E/O) converter 203 that converts an analog signal from the D/A converter 202 into an optical signal and outputs an optical transmission signal to the communication channel 2. The digital signal processing optical transceiver 20 further includes an optical/electrical (O/E) converter 204 that converts an optical reception signal from the communication channel 2 into an analog signal, an analog/digital (A/D) converter 205 that converts the analog signal into soft-decision reception data of q bits, and a soft-decision FEC decoder 206 as an inner-code FEC-decoding unit that performs soft-decision decoding of the soft-decision reception data, corrects errors, and outputs an SFI reception signal to the OTUk framer 10.

Figure 3:
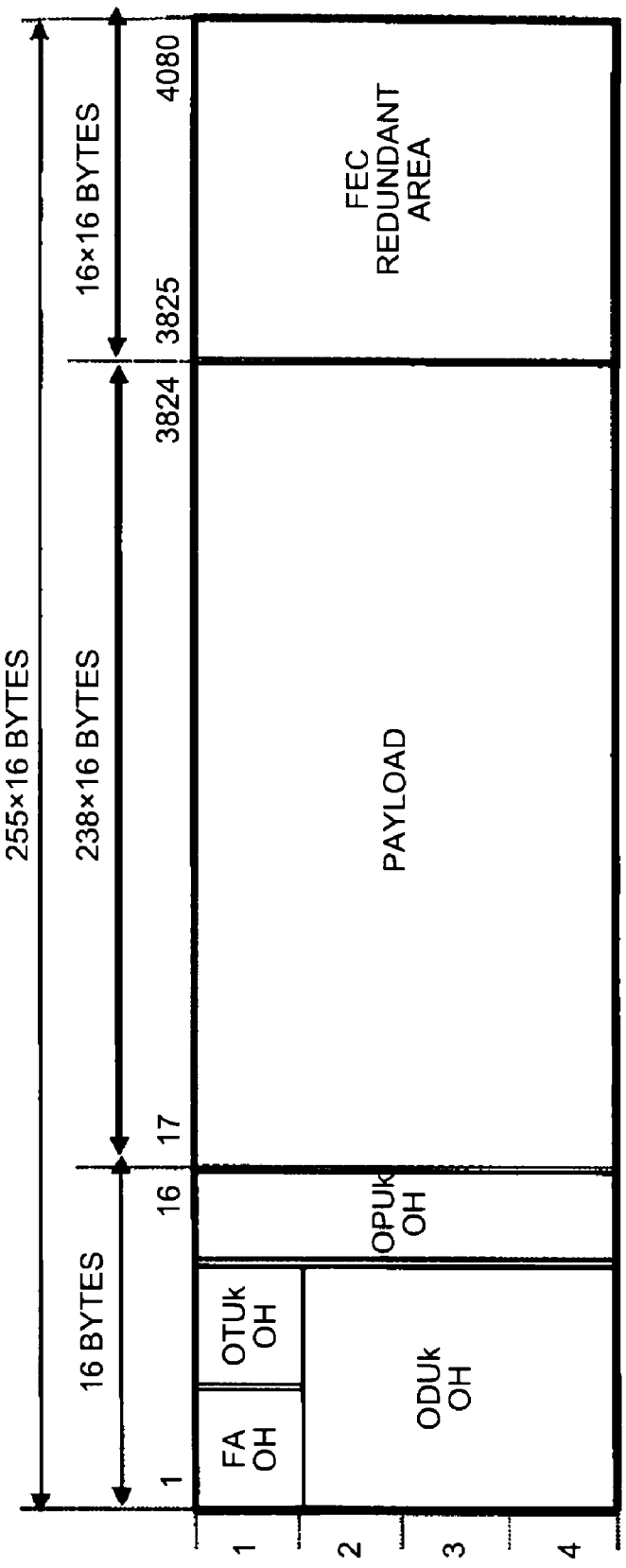
FIG. 3 is a schematic diagram for explaining the error correcting device according to the first embodiment.

FIG. 3 is a configuration diagram of an OTUk frame defined in ITU-T Recommendation G.709, for example. As shown in FIG. 3, the OTUk frame includes a payload for storing therein practical communication data such as a client signal, a frame alignment overhead (FA OH) for frame synchronization, an OTUk OH and an optical channel data unit-k overhead (ODUk OH) for maintenance and monitor information, and an optical channel payload unit-k overhead (OPUk OH) for payload mapping. The OTUk frame further includes an FEC redundant area for storing therein information of an error correction code for correcting bit errors caused due to deterioration in an optical quality after transmission. A Reed-Solomon code (hereinafter, "RS code") (255, 239) is usually used as the error correction code. A portion composed of the FA OH, the OTUk OH, the ODUk OH, and the OPUk OH is generally called overhead.

In this way, the optical communication system forms a transmission frame by adding an overhead and an error correction code to a payload as information data to be practically transmitted, and then transmits the formed transmission frame at a high speed and over a long distance.

Figure 4A:
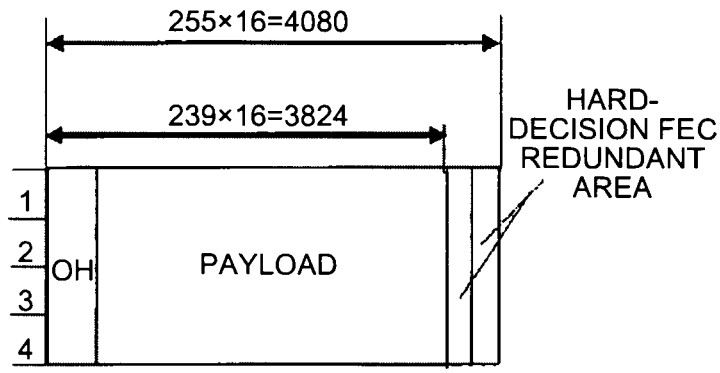
FIGS. 4A and 4B are schematic diagrams explaining the error correcting device according to the first embodiment.
Figure 4B:
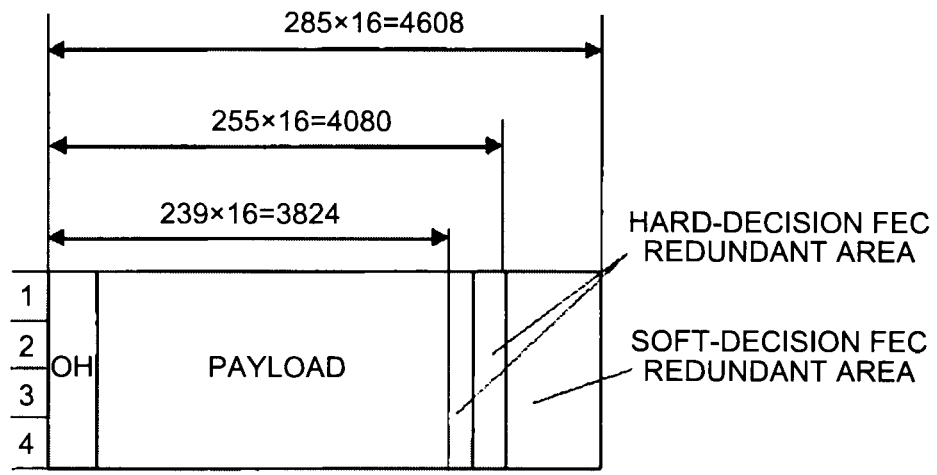

An operation of the first embodiment is explained with reference to FIGS. 4A and 4B. FIG. 4A depicts a configuration of a transmission frame in an SFI transmission signal and an SFI reception signal exchanged between the OTUk framer 10 and the digital signal processing optical transceiver 20. While the transmission frame has the same configuration as that of the OTUk frame shown in FIG. 3, an FEC redundant area is divided into two hard-decision FEC redundant areas. FIG. 4B depicts a configuration of a transmission frame in an output signal from the soft-decision FEC encoder 201 and an input signal to the soft-decision FEC decoder 206. In the transmission frame depicted in FIG. 4B, a soft-decision FEC redundant area is added to the transmission frame shown in FIG. 4A. The OTUk frame generator 101 first performs mapping of a client transmission signal to the payload shown in FIG. 4A and adds various types of overhead information to the OH. The hard-decision FEC encoder 102 performs error correction coding with an outer code and stores error correction code information in the hard-decision FEC redundant area. The hard-decision FEC encoder 102 performs concatenated coding with an RS code and a BCH code, for example, and stores corresponding error correction code information in the FEC redundant areas divided into two, respectively. The soft-decision FEC encoder 201 then performs error correction coding with an inner code for soft-decision decoding, for example, LDPC coding, and stores error correction code information in the soft-decision FEC redundant area.

On the receiving end, the A/D converter 205 performs A/D conversion of a reception analog signal with a quality deteriorated in the communication channel, and outputs soft-decision reception data of q bits to the soft-decision FEC decoder 206. The soft-decision FEC decoder 206 performs soft-decision decoding by using the soft-decision information of q bits and the error correction code information of the LDPC code stored in the soft-decision FEC redundant area, and outputs an SFI reception signal to the OTUk frame terminator 103.

Figure 5:
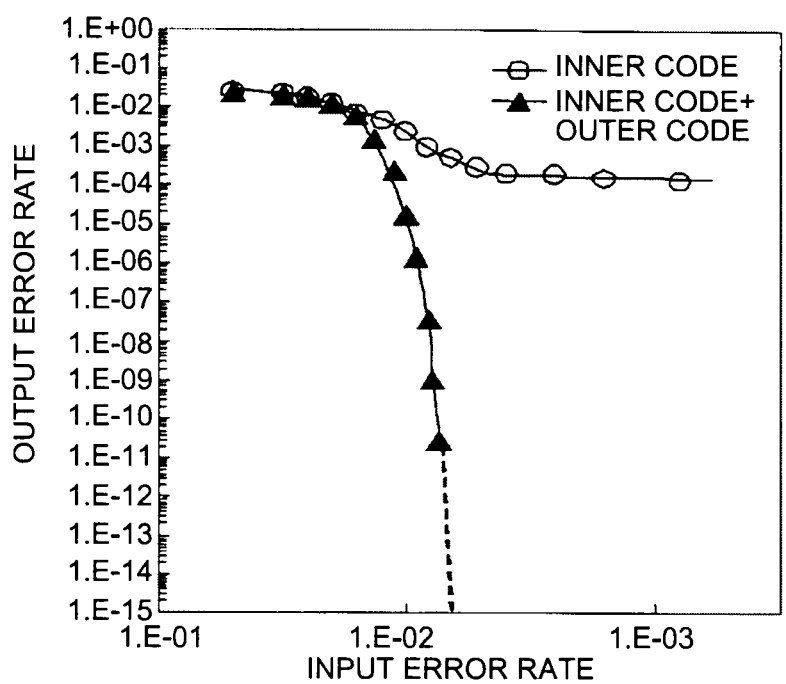
FIG. 5 is a schematic diagram explaining the error correcting device according to the first embodiment.

Because the soft-decision decoding is performed in the decoding process of the soft-decision FEC decoder 206, a certain degree of error correction can be achieved even when an input error rate is high. However, as shown by a line of an inner code in FIG. 5, residual errors occur and an error floor phenomenon arises. Therefore, the hard-decision FEC decoder 104 performs repeated decoding for a concatenated code of an RS code and a BCH code, for example, to resolve the error floor phenomenon.

As described above, the soft-decision FEC code capable of correcting bit errors at a high rate into bit errors at a moderate rate is used as the inner code, and a hard-decision concatenated code capable of avoiding an error floor phenomenon of bit errors at a moderate rate is used as the outer code. Therefore, it is possible to increase error correction efficiency while suppressing an increase in the transmission rate, and a high-speed and long-distance optical communication system can be realized.

The hard-decision FEC coding process is performed for the OTUk frame, and the soft-decision FEC coding process is performed for the redundant area that is additionally provided to the OTUk frame. The OTUk framer performs the hard-decision FEC coding and decoding, and the digital signal processing optical transceiver performs the soft-decision FEC coding and decoding. Therefore, a semiconductor integrated circuit in appropriate circuit scale allocation can be achieved.

In the first embodiment, the example in which the LDPC code for soft-decision FEC is used as an inner code is described. However, another soft-decision FEC code, for example, a convolutional code or a block turbo code can be used. While the example in which a concatenated code of an RS code and a BCH code is used as an outer code for hard-decision FEC is described, another concatenated code, for example, a concatenated code of an RS code and an RS code or a concatenated code of a BCH code and a BCH code can be used. The same effect as that of the first embodiment can be obtained even when an iterated code is used as an outer code.

In the first embodiment, interleaving or deinterleaving can be performed as needed at a previous or subsequent stage of each error correction coding process, to distribute errors occurring in a transmission channel during error correction decoding.

Figure 6A:
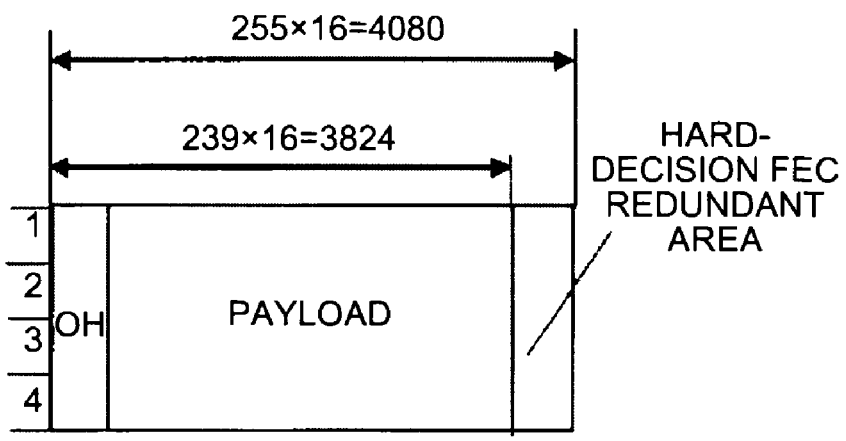
FIGS. 6A and 6B are schematic diagrams explaining an error correcting device according to a second embodiment of the present invention.
Figure 6B:
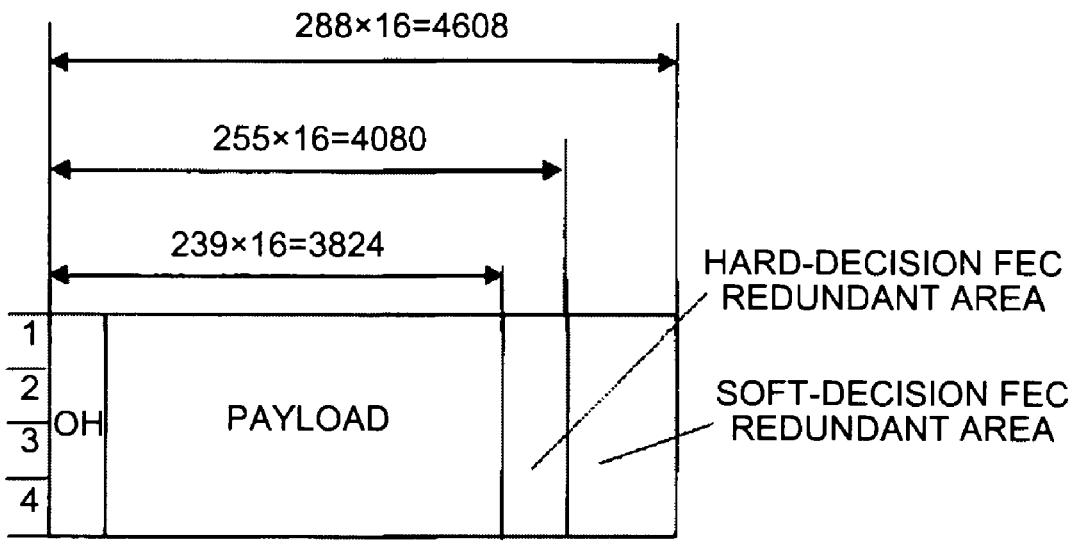

In the first embodiment, a concatenated code or an iterated code is used for hard-decision FEC of an outer code. Another embodiment in which a hard-decision FEC redundant area that is the same as that in an OTUk frame is used for an outer code as shown in FIGS. 6A and 6B is explained next as a second embodiment of the present invention. Configurations and operations of the second embodiment are the same as those of the first embodiment except for a configuration and an operation related to the outer code. A common RS code (255, 239) or a parent code of an RS code (1020, 956) with a larger code length can be used for hard-decision FEC, for example. In this way, the same operational effect as that in the first embodiment, such as realization of a semiconductor integrated circuit in appropriate circuit scale allocation, can be obtained.

Figure 7A:
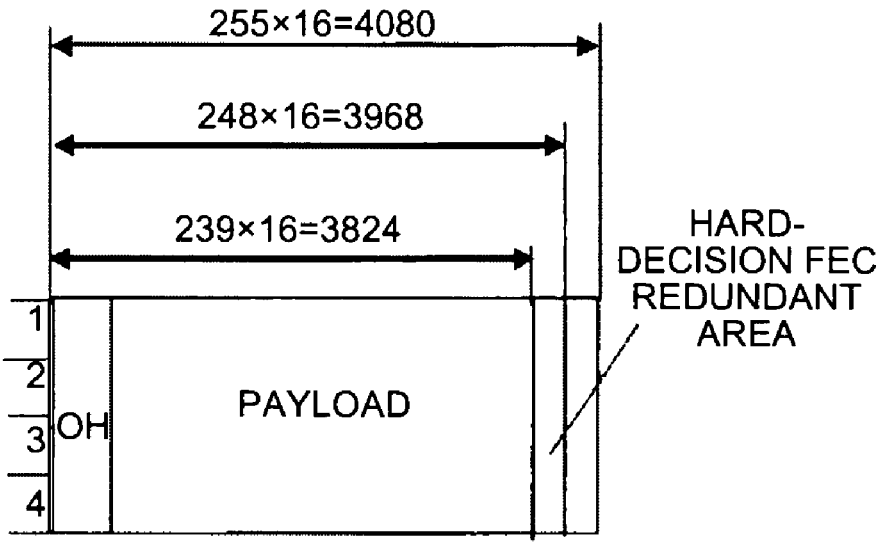
FIGS. 7A and 7B are schematic diagrams explaining an error correcting device according to a third embodiment of the present invention.
Figure 7B:
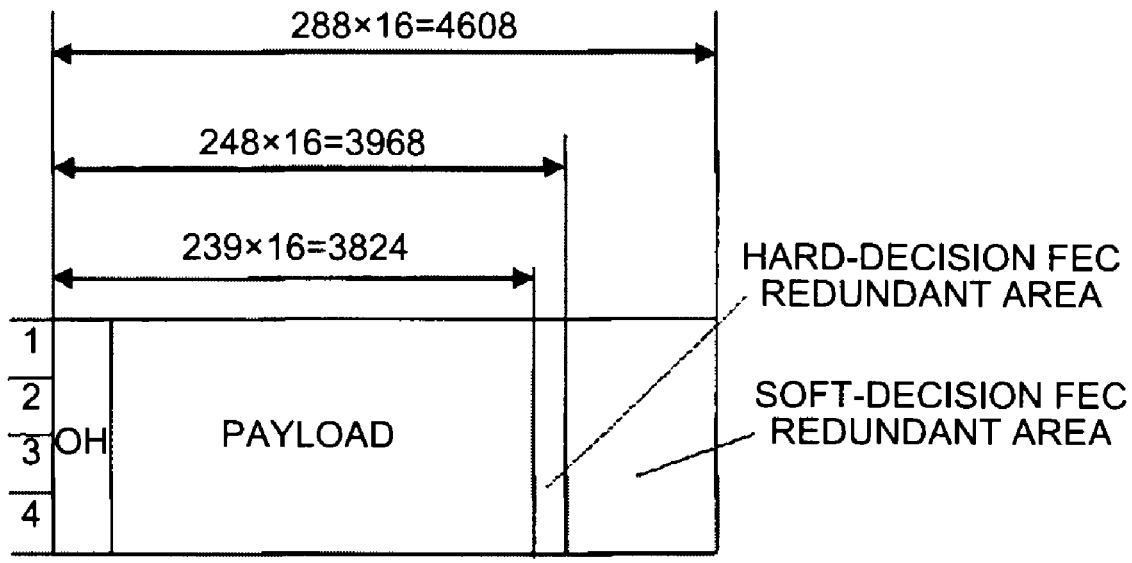

In the second embodiment, a code such as the RS code is used for hard-decision FEC of an outer code, and coding information of the outer code is stored in a redundant area of an OTUk frame. Another embodiment in which part of an FEC redundant area of an OTUk frame is used for an outer code, and the remaining part of the FEC redundant area and an FEC redundant area additionally provided to the OTUk frame are used as an FEC redundant area for an inner code as shown in FIGS. 7A and 7B is explained as a third embodiment of the present invention. Configurations and operations of the third embodiment are the same as those of the first embodiment except for a configuration and an operation related to the outer code. An RS code (248, 239) or a parent code of an RS code (992, 956) with a larger code length can be used for hard-decision FEC, for example. In this way, the same operational effect as that in the first embodiment, such as realization of a semiconductor integrated circuit in appropriate circuit scale allocation, can be obtained.

According to the present invention, in an error correcting device, many residual errors caused by soft-decision decoding of an inner code are corrected, even in a transmission channel that causes a higher rate of bit errors, by using an outer code capable of suppressing an increase in a transmission rate, thereby avoiding occurrence of an error floor. Therefore, a high-quality and high-speed optical communication system can be provided.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An error correcting device in an optical communication system that transmits a transmission frame formed by adding an overhead and an error correction code to information data, the error correcting device comprising:
    an outer-code forward error correction (FEC)-coding unit that performs FEC coding with an outer code for the transmission frame by using a concatenated code or an iterated code of at least two error correction codes as the outer code, and partitions columns of a first FEC redundant area in an optical channel transport unit-k (OTUk) frame having N rows included in the transmission frame into at least two portions each having N rows to store therein information indicating the at least two error correction codes as the outer code, respectively;
    an inner-code FEC-coding unit that performs FEC coding with an inner code for the transmission frame by using an error correction code for soft-decision decoding as the inner code, and additionally provides a second FEC redundant area having N rows and being adjacent to the first FEC redundant area for the inner code in the OTUk frame to store therein the error correction code for soft-decision decoding of the inner code;
    an inner-code FEC-decoding unit that performs soft-decision FEC decoding with the inner code for a transmission frame received; and
    an outer-code FEC-decoding unit that performs hard-decision FEC decoding with the outer code for the transmission frame subjected to the soft-decision FEC decoding by the inner-code FEC-decoding unit.

2. The error correcting device according to claim 1, wherein the inner code is a low-density parity-check (LDPC) code.

3. The error correcting device according to claim 1, wherein the outer code is a concatenated code or an iterated code of a Reed-Solomon (RS) code and a Bose-Chaudhuri-Hocquenghem (BCH) code.

4. The error correcting device according to claim 1, wherein the outer code is a concatenated code or an iterated code of a BCH code and a BCH code.

5. The error correcting device according to claim 1, wherein the outer code is a concatenated code or an iterated code of an RS code and an RS code.

6. The error correcting device according to claim 1, wherein the outer-code FEC-decoding unit performs repeated decoding.

7. The error correcting device according to claim 1, wherein the outer-code FEC-coding unit and the outer-code FEC-decoding unit are implemented in an OTUk framer, and the inner-code FEC-coding unit and the inner-code FEC-decoding unit are implemented in an optical transceiver.

8. An error correcting method used in an optical communication system that transmits a transmission frame formed by adding an overhead and an error correction code to information data, the error correcting method comprising:
    performing FEC coding with an outer code for the transmission frame by using a concatenated code or an iterated code of at least two error correction codes as the outer code, and partitioning columns of a first FEC redundant area in an optical channel transport unit-k (OTUk) frame having N rows included in the transmission frame into at least two portions each having N rows to store therein information indicating the at least two error correction codes as the outer code, respectively;
    performing FEC coding with an inner code for the transmission frame by using an error correction code for soft-decision decoding as the inner code, and additionally providing a second FEC redundant area having N rows and being adjacent to the first FEC redundant area for the inner code in the OTUk frame to store therein the error correction code for soft-decision decoding of the inner code;
    performing soft-decision FEC decoding with the inner code for a transmission frame received; and
    performing hard-decision FEC decoding with the outer code for the transmission frame subjected to the soft-decision FEC decoding by the inner-code FEC-decoding step.

9. An error correcting method used in an optical communication system that transmits a transmission frame formed by adding an overhead and an error correction code to information data, the error correcting method comprising:
    performing FEC coding with an outer code for the transmission frame by using a concatenated code or an iterated code of at least two error correction codes as the outer code, and partitioning columns of a first FEC redundant area in an optical channel transport unit-k (OTUk) frame having N rows included in the transmission frame into at least two portions each having N rows to store therein information indicating the at least two error correction codes as the outer code, respectively;

performing FEC coding with an inner code for the transmission frame by using an error correction code for soft-decision decoding as the inner code, and additionally providing a second FEC redundant area having N rows and being adjacent to the first FEC redundant area for the inner code in the OTUk frame to store therein the error correction code for soft-decision decoding of the inner code.

* * * * *